(12) United States Patent
Chao et al.

(10) Patent No.: US 12,444,717 B2
(45) Date of Patent: Oct. 14, 2025

(54) SPLICING CONFIGURATION OF DISPLAY DEVICES

(71) Applicant: Innolux Corporation, Miaoli County (TW)

(72) Inventors: Kuang-Pin Chao, Miaoli County (TW); Min-Han Tsai, Miaoli County (TW); Hao-Jung Huang, Miaoli County (TW)

(73) Assignee: Innolux Corporation, Miaoli County (TW)

( * ) Notice: Subject to any disclaimer, the term of this patent is extended or adjusted under 35 U.S.C. 154(b) by 491 days.

(21) Appl. No.: 18/086,685

(22) Filed: Dec. 22, 2022

(65) Prior Publication Data
US 2023/0238366 A1     Jul. 27, 2023

Related U.S. Application Data

(60) Provisional application No. 63/303,034, filed on Jan. 26, 2022.

(30) Foreign Application Priority Data

Oct. 14, 2022 (CN) .......................... 202211260926.5

(51) Int. Cl.
    *H01L 29/20*         (2006.01)
    *H01L 25/075*       (2006.01)
    (Continued)

(52) U.S. Cl.
CPC .......... *H01L 25/13* (2013.01); *H01L 25/0753* (2013.01); *G09F 9/3026* (2013.01); *G09F 9/33* (2013.01)

(58) Field of Classification Search
CPC ... H01L 25/13; H01L 25/0753; G09F 9/3026; G09F 9/33; G06F 3/1446; G09G 2300/026
See application file for complete search history.

(56) References Cited

U.S. PATENT DOCUMENTS

2019/0305073 A1\* 10/2019 Chen .................... H01L 25/0753
2020/0251457 A1\* 8/2020 Huang ................ H01L 25/0753
2024/0405157 A1\* 12/2024 Ma ............................ G09F 9/33

FOREIGN PATENT DOCUMENTS

CN             107067988        1/2020

\* cited by examiner

*Primary Examiner* — Ismail A Muse
(74) *Attorney, Agent, or Firm* — JCIPRNET (57) ABSTRACT

A splicing device includes a first splicing unit and a second splicing unit. The first splicing unit includes a first substrate, a first light-emitting unit, and a second light-emitting unit. The second splicing unit includes a second substrate, a third light-emitting unit, and a fourth light-emitting unit. P is a pitch between the first light-emitting unit and the second light-emitting unit, and a pitch between the third light-emitting unit and the fourth light-emitting unit. LA1 is a horizontal distance from a center of the second light-emitting unit to a first reference plane. LB3 is a horizontal distance from a boundary between a light-emitting surface of the second splicing unit and a second reference plane to the first reference plane. LB1x and LB1y are respectively a horizontal component and a vertical component of a distance from the boundary to a center of the third light-emitting unit. LA2 is a vertical distance from the light-emitting surface of the first splicing unit to a bottom surface of the first substrate. LB2 is a vertical distance from the bottom surface of the first substrate to the boundary. The splicing device satisfies:

$$\frac{\sqrt{(LA1+LB3+LB1x)^2+(LA2+LB2+LB1y)^2}}{P} \leq 1.5.$$

20 Claims, 10 Drawing Sheets

(51) Int. Cl.
*H01L 25/13* (2006.01)
*H01L 33/00* (2010.01)
 *G09F 9/302* (2006.01)
 *G09F 9/33* (2006.01)

SPLICING CONFIGURATION OF DISPLAY DEVICES

CROSS-REFERENCE TO RELATED APPLICATION

This application claims the priority benefits of U.S. provisional application Ser. No. 63/303,034, filed on Jan. 26, 2022 and China application serial no. 202211260926.5, filed on Oct. 14, 2022. The entirety of the above-mentioned patent applications is hereby incorporated by reference herein and made a part of this specification.

BACKGROUND

Technical Field

The disclosure relates to an electronic device, and more particularly, to a splicing device.

Description of Related Art

Splicing displays may be applied not only to large video walls, but also to some electronic devices with special angles to play advertising content or demonstrate virtual stereoscopic video, thereby attracting attentions of passers-by. Such applications may be found in some public spaces such as shopping malls, stations, business districts, museums, etc. In an existing splicing device, at a certain viewing angle, a splicing seam (a dark line) at the corner is easily observed, resulting in discontinuity of a displayed image.

SUMMARY

The disclosure is directed to a splicing device, which helps to mitigate an issue of discontinuity of a displayed image.

An embodiment of the disclosure provides a splicing device having a splicing position. The splicing device includes a first splicing unit and a second splicing unit. The first splicing unit includes a first substrate, a first light-emitting unit, and a second light-emitting unit. The first light-emitting unit and the second light-emitting unit are disposed on the first substrate, and the second light-emitting unit is located between the first light-emitting unit and the splicing position. A pitch between the first light-emitting unit and the second light-emitting unit is P. The second splicing unit is adjacent to the first splicing unit at the splicing position and includes a second substrate, a third light-emitting unit, and a fourth light-emitting unit. The third light-emitting unit and the fourth light-emitting unit are disposed on the second substrate. The third light-emitting unit is located between the splicing position and the fourth light-emitting unit, and a pitch between the third light-emitting unit and the fourth light-emitting unit is also P. The splicing device satisfies a following formula:

$$\frac{\sqrt{(LA1 + LB3 + LB1x)^2 + (LA2 + LB2 + LB1y)^2}}{P} \leq 1.5$$

where LA1 is a horizontal distance from a center of the second light-emitting unit to a first reference plane, the first reference plane is perpendicular to a light-emitting surface of the first splicing unit and passes through an upper edge of the first substrate adjacent to the splicing position, LB3 is a horizontal distance from a boundary between a light-emitting surface of the second splicing unit and a second reference plane to the first reference plane, the second reference plane is perpendicular to the light-emitting surface of the second splicing unit and passes through an upper edge of the second substrate adjacent to the splicing position, $LB1x$ is a horizontal component of a distance from the boundary to a center of the third light-emitting unit, LA2 is a vertical distance from the light-emitting surface of the first splicing unit to a bottom surface of the first substrate, LB2 is a vertical distance from the bottom surface of the first substrate to the boundary, and $LB1y$ is a vertical component of the distance from the boundary to the center of the third light-emitting unit.

In order for the aforementioned features and advantages of the disclosure to be more comprehensible, several embodiments accompanied with drawings are described in detail as follows.

BRIEF DESCRIPTION OF THE DRAWINGS

The accompanying drawings are included to provide a further understanding of the disclosure, and are incorporated in and constitute a part of this specification. The drawings illustrate embodiments of the disclosure and, together with the description, serve to explain the principles of the disclosure.

DESCRIPTION OF THE EMBODIMENTS

Reference will now be made in detail to the present preferred embodiments of the disclosure, examples of which are illustrated in the accompanying drawings. Wherever possible, the same reference numbers are used in the drawings and the description to refer to the same or like parts.

Throughout this disclosure and the appended claims, certain terms may be used to refer to particular components. Those skilled in the art should understand that electronic device manufacturers may refer to the same components by different names. This specification does not intend to distinguish between components that have the same function but have different names. In the following description and claims, words such as "containing" and "comprising" are open-ended words, so they should be interpreted as meaning "including but not limited to . . . ".

The directional terms mentioned in this specification, such as "up", "down", "front", "rear", "left", "right", etc., only refer to the directions of the drawings. Therefore, the used directional terminology is illustrative, and is not used for limiting the disclosure. In the drawings, various figures illustrate the general characteristics of methods, structures and/or materials used in particular embodiments. However, these drawings should not be construed to define or limit the scope or nature encompassed by these embodiments. For example, the relative sizes, thicknesses and positions of various layers, regions and/or structures may be reduced or exaggerated for clarity's sake.

One structure (or layer, element, substrate) described in the disclosure is located on/above another structure (or layer, element, substrate), which means that the two structures are adjacent and in direct connection, or means that the two structures are adjacent but in indirect connection. Indirect connection means that there is at least one intermediate structure (or intermediate layer, intermediate element, intermediate substrate, intermediate space) between the two structures, a lower surface of a structure is adjacent or directly connected to an upper surface of the intermediate structure, and an upper surface of the other structure is adjacent to or directly connected to a lower surface of the intermediate structure. The intermediary structure may be composed of a single-layer or multi-layer physical structure or non-physical structure, which is not limited by the disclosure. In the disclosure, when a certain structure is described to be "on" another structure, it means that the certain structure is "directly" on the another structure, or means that the certain structure is "indirectly" on the another structure, i.e., at least one structure is further clamped between the certain structure and the another structure.

The terms "about", "equal to", "equal" or "same", "substantially" or "approximately" are generally interpreted as being within 20% of a given value or range, or interpreted as being within 10%, 5%, 3%, 2%, 1%, or 0.5% of the given value or range. In addition, the terms "the range is from a first value to a second value", "the range falls between a first value to a second value" mean that the range includes the first value, the second value, and other values there between.

The ordinal numbers used in the specification and claims, such as "first", "second", etc., are used to modify components, and do not imply and represent that the component or these components have any previous ordinal numbers, and do not represent a sequence of one component with another, or a sequence in a manufacturing method. The use of these ordinal numbers is only to make a clear distinction between one component with a certain name and another component with the same name. The same terms may not be used in the claims and the specification, and accordingly, a first component in the specification may be a second component in the claims.

The electrical connection or coupling described in this disclosure may refer to direct connection or indirect connection. In the case of direct connection, terminals of components on two circuits are directly connected or connected to each other by a conductor line segment, and in the case of indirect connection, there are switches, diodes, capacitors, inductors, resistors, other suitable components, or a combination of the above components between the terminals of the components on the two circuits, but the disclosure is not limited thereto.

In the disclosure, a length, width, thickness, height, area or distance or space between components may be measured by using an optical microscopy (OM), a scanning electron microscope (SEM), an α-step, an ellipsometer or other suitable methods. In detail, according to some embodiments, a scanning electron microscope may be used to obtain a cross-sectional structure image including the components to be measured, and measure a length, width, thickness, height or area of each component, or a distance or spacing between the components, but the disclosure is not limited thereto.

In addition, there may be a certain error in any two values or directions used for comparison. In addition, the expressions "the given range is a first value to a second value", "the given range falls within a range of the first value to the second value" mean that the given range includes the first value, the second value, and other values there between. If a first direction is perpendicular to a second direction, an angle between the first direction and the second direction may be between 80 degrees and 100 degrees; and if the first direction is parallel to the second direction, the angle between the first direction and the second direction may be between 0 degree and 10 degrees.

Unless otherwise defined, all terms (including technical and scientific terms) used herein have the same meanings as commonly understood by those skilled in the art to which this disclosure belongs. It is understandable that these terms, such as those defined in commonly used dictionaries, should be interpreted as having meaning consistent with the relevant technology and the background or context of this disclosure, and should not be interpreted in an idealized or excessively formal way, unless there is a special definition in the embodiment of the disclosure.

In the disclosure, the electronic device may include a display device, a backlight device, an antenna device, a sensing device, or a splicing device, but the disclosure is not limited thereto. The electronic device may be a bendable or flexible electronic device. The display device may be a non-self-luminous type display device or a self-luminous type display device. The electronic device may include, for example, liquid crystal, light-emitting diodes, fluorescence, phosphor, quantum dot (QD), other suitable display media, or a combination thereof. The antenna device may be a liquid crystal type antenna device or a non-liquid crystal type antenna device, and the sensing device may be a sensing device that senses capacitance, light, heat, or ultrasound, but the disclosure is not limited thereto. In the disclosure, the electronic device may include electronic components, and the electronic components may include passive components and active components, such as capacitors, resistors, inductors, diodes, transistors, etc. The diode may include a light-emitting diode or a photodiode. The light-emitting diode may include, for example, an organic light-emitting diode (OLED), a mini LED, a micro LED or a quantum dot LED, but the disclosure is not limited thereto. The splicing device may be, for example, a display splicing device or an antenna splicing device, but the disclosure is not limited thereto. It should be noted that the electronic device may be any arrangement and combination of the foregoing, but the disclosure is not limited thereto. In addition, the shape of the electronic device may be rectangular, circular, polygonal, a shape with curved edges, or other suitable shapes. The electronic device may have peripheral systems such as a driving system, a control system, a light source system, etc. to support the display device, the antenna device, a wearable device (for example, including augmented reality or virtual reality), an in-vehicle device (for example, including a car windshield), or the splicing device.

FIG. 1 to FIG. 10 are respectively schematic partial cross-sectional views of splicing devices according to various embodiments of the disclosure. It should be noted that the technical solutions provided in FIG. 1 to FIG. 10 may be replaced, combined or used in combination with each other, so as to constitute another embodiment without violating the spirit of the disclosure.

Figure 1:
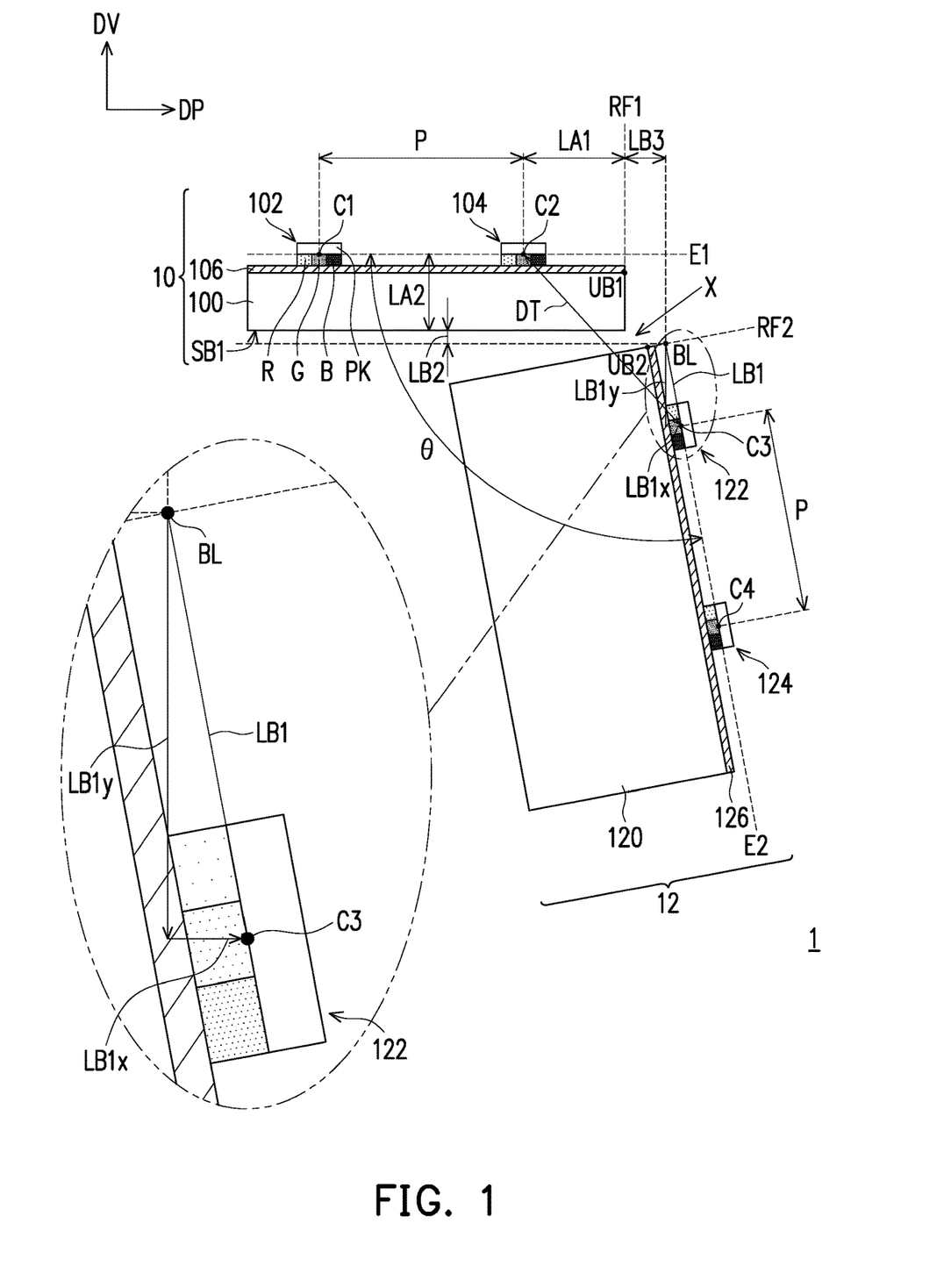
FIG. 1 to FIG. 10 are respectively schematic partial cross-sectional views of splicing devices according to various embodiments of the disclosure.

Referring to FIG. 1, a splicing device 1 has a splicing position X. The splicing position X is a region/position where multiple splicing units of the splicing device 1 are spliced together. Taking FIG. 1 as an example, the splicing device 1 may include a first splicing unit 10 and a second splicing unit 12, and the splicing position X is a region/position where the second splicing unit 12 is closely adjacent to the first splicing unit 10.

The first splicing unit 10 may include a first substrate 100, a first light-emitting unit 102 and a second light-emitting unit 104, but the disclosure is not limited thereto. For example, the first splicing unit 10 may further include a circuit layer 106 and a driving circuit (not shown), but the disclosure is not limited thereto.

The first substrate 100 is used to carry the first light-emitting unit 102, the second light-emitting unit 104, the circuit layer 106 and the driving circuit (not shown). The first substrate 100 may be a rigid substrate or a flexible substrate. The first substrate 100 may include glass, quartz, ceramic, sapphire, printed circuit board (PCB), plastic, other suitable materials, or a combination of the above materials, but the disclosure is not limited thereto. The plastic may include polycarbonate (PC), polyimide (PI), polypropylene (PP), polyethylene terephthalate (PET), other suitable flexible material or a combination thereof, but the disclosure is not limited thereto. In addition, a light transmittance of the first substrate 100 is not limited, i.e., the first substrate 100 may be a light transmissive substrate, a semi-light transmissive substrate or a non-light transmissive substrate.

The first light-emitting unit 102 is disposed on the first substrate 100. The first light-emitting unit 102 includes, for example, a red light-emitting diode R, a green light-emitting diode G, a blue light-emitting diode B, and a package layer PK, but the disclosure is not limited thereto. According to different requirements, the first light-emitting unit 102 may further include other elements or film layers, which is not limited by the disclosure.

The red light-emitting diode R, the green light-emitting diode G, and the blue light-emitting diode B are, for example, arranged on the first substrate 100 along a horizontal direction DP. Each of the red light-emitting diode R, the green light-emitting diode G, and the blue light-emitting diode B may include a light-emitting diode (LED), a mini-LED, a micro LED, or a quantum dot LED. The package layer PK covers the red light-emitting diode R, the green light-emitting diode G, and the blue light-emitting diode B. A material of the package layer PK may include a transparent material, a water and oxygen blocking material, other suitable materials or a combination thereof, but the disclosure is not limited thereto. For example, the material of the package layer PK may include epoxy, acrylic-based resin, silicone, polyimide polymer, or a combination thereof, but the disclosure is not limited thereto.

The second light-emitting unit 104 is disposed on the first substrate 100, and the second light-emitting unit 104 is located between the first light-emitting unit 102 and the splicing position X. In other words, the second light-emitting unit 104 is closer to the splicing position X of the splicing device 1 than the first light-emitting unit 102. The second light-emitting unit 104 may have the same or similar structure as that of the first light-emitting unit 102, and detail thereof is not repeated here.

A pitch between the first light-emitting unit 102 and the second light-emitting unit 104 is P. The pitch P may be the shortest distance from a center of the first light-emitting unit 102 (for example, a center C1 on the top of the green light-emitting diode G) to a center of the second light-emitting unit 104 (for example, a center C2 on the top of the green light-emitting diode G). Alternatively, the pitch P may be the shortest distance from an edge (for example, a left edge or a right edge) of the first light-emitting unit 102 to a corresponding edge (for example, a left edge or a right edge) of the second light-emitting unit 104.

According to different requirements, the first splicing unit 10 may also include other light-emitting units. In other words, the number of light-emitting units in the first splicing unit 10 may be greater than 2, and the light-emitting units may be arranged in an array on the first substrate 100.

The circuit layer 106 is disposed on the first substrate 100 and located between the first light-emitting unit 102 and the first substrate 100 and between the second light-emitting unit 104 and the first substrate 100. The circuit layer 106 may include a patterned conductive pattern, and the first light-emitting unit 102 and the second light-emitting unit 104 may be electrically connected to a driving circuit (not shown) through the circuit layer 106. A material of the circuit layer 106 may include a transparent conductive material or a non-transparent conductive material. The transparent conductive material may include metal oxides, graphene, carbon nanotubes, other suitable transparent conductive materials, or a combination thereof, but the disclosure is not limited thereto. The non-transparent conductive material may include metals, alloys, or combinations thereof, but the disclosure is not limited thereto.

The driving circuit (not shown) is provided on the first substrate 100. In some embodiments, the driving circuit may be disposed on a light-emitting side of the first substrate 100 (for example, the side where the first light-emitting unit 102 and the second light-emitting unit 104 are located). In some other embodiments, the driving circuit may be disposed on a back side of the first substrate 100 (for example, an opposite side of the light-emitting side), and the circuit layer 106 may be electrically connected to the driving circuit through a conductive through hole (not shown) penetrating through the first substrate 100, a flexible printed circuit board (FPC, not shown), a conductive layer (not shown) disposed on a sidewall of the first substrate 100 or other forms of connectors (not shown).

The second splicing unit 12 is adjacent to the first splicing unit 10 at the splicing position X and includes a second substrate 120, a third light-emitting unit 122 and a fourth light-emitting unit 124, but the disclosure is not limited thereto. For example, the second splicing unit 12 may further include a circuit layer 126 and a driving circuit (not shown), but the disclosure is not limited thereto.

The second substrate 120 is used to carry the third light-emitting unit 122, the fourth light-emitting unit 126, the circuit layer 126 and the driving circuit (not shown). The second substrate 120 may be a rigid substrate or a flexible substrate. The second substrate 120 may include glass, quartz, ceramic, sapphire, printed circuit board (PCB), plastic, other suitable materials, or a combination of the above materials, but the disclosure is not limited thereto. The plastic may include polycarbonate (PC), polyimide (PI), polypropylene (PP), polyethylene terephthalate (PET), other suitable flexible material or a combination thereof, but the disclosure is not limited thereto. In addition, a light transmittance of the second substrate 120 is not limited, i.e., the second substrate 120 may be a light transmissive substrate, a semi-light transmissive substrate or a non-light transmissive substrate.

The third light-emitting unit 122 is disposed on the second substrate 120. The third light-emitting unit 122 may have the same or similar structure as that the first light-emitting unit 102, and detail thereof is not repeated here.

The fourth light-emitting unit 124 is disposed on the second substrate 120. The third light-emitting unit 122 is located between the splicing position X and the fourth light-emitting unit 124. In other words, the third light-emitting unit 122 is closer to the splicing position X of the splicing device 1 than the fourth light-emitting unit 124. The fourth light-emitting unit 124 may have the same or similar structure as that the first light-emitting unit 102, and detail thereof is not repeated.

The first splicing unit 10 and the second splicing unit 12 may have the same pitch. In other words, a pitch between the third light-emitting unit 122 and the fourth light-emitting unit 124 may also be P. The pitch P may be the shortest distance from a center of the third light-emitting unit 122 (for example, a center C3 on the top of the green light-emitting diode G) to a center of the fourth light-emitting unit 124 (for example, a center C4 on the top of the green light-emitting diode G). Alternatively, the pitch P may be the shortest distance from an edge (for example, a left edge or a right edge) of the third light-emitting unit 122 to a corresponding edge (for example, a left edge or a right edge) of the fourth light-emitting unit 124.

According to different requirements, the second splicing unit 12 may also include other light-emitting units. In other words, the number of light-emitting units in the second splicing unit 12 may be greater than 2, and the light-emitting units may be arranged in an array on the second substrate 120.

The circuit layer 126 is disposed on the second substrate 120 between the third light-emitting unit 122 and the second substrate 120 and between the fourth light-emitting unit 124 and the second substrate 120. The circuit layer 126 may include a patterned conductive pattern, and the third light-emitting unit 122 and the fourth light-emitting unit 124 may be electrically connected to a driving circuit (not shown) through the circuit layer 126. A material of the circuit layer 126 may be the same or similar to the material of the circuit layer 106, and detail thereof is not repeated.

The driving circuit (not shown) is provided on the first substrate 100. In some embodiments, the driving circuit may be disposed on a light-emitting side of the second substrate 120 (for example, the side where the third light-emitting unit 122 and the fourth light-emitting unit 124 are located). In some other embodiments, the driving circuit may be disposed on a back side of the second substrate 120 (for example, an opposite side of the light-emitting side), and the circuit layer 126 may be electrically connected to the driving circuit through a conductive through hole (not shown) penetrating through the second substrate 120, a flexible printed circuit board (FPC, not shown), a conductive layer (not shown) disposed on a sidewall of the second substrate 120 or other forms of connectors (not shown).

By reducing a distance DT between the light-emitting unit (such as the second light-emitting unit 104) closest to the splicing position X in the first splicing unit 10 and the light-emitting unit (such as the third light-emitting unit 122) closest to the splicing position X in the second splicing unit 12, for example by making the distance DT to be the same or close to the pitch P, visibility of a splicing seam at the corner may be reduced, thereby mitigating a problem of discontinuity of a displayed image. According to simulation analysis, when the distance DT is less than or equal to 1.5 times of the pitch P, the visibility of the splicing seam at the corner may be reduced, which helps to mitigate the problem of discontinuity of the displayed image. Through the Pythagorean theorem, a following formula may be obtained:

$$\frac{\sqrt{(LA1 + LB3 + LB1x)^2 + (LA2 + LB2 + LB1y)^2}}{P} \leq 1.5$$

where definitions of various parameters in the above formula are as follows:

LA1 is a horizontal distance from a center of the second light-emitting unit 104 (for example, a center C2 on the top of the green light-emitting diode G) to a first reference plane RF1, i.e., a distance from the center C2 to the first reference plane RF1 in the horizontal direction DP;

the first reference plane RF1 is perpendicular to a light-emitting surface E1 of the first splicing unit 10 and passes through an upper edge UB1 of the first substrate 100 adjacent to the splicing position X;

the light-emitting surface E1 of the first splicing unit 10 is flushed with top surfaces of multiple light-emitting diodes (such as the red light-emitting diode R, the green light-emitting diode G, and the blue light-emitting diode B) in the first splicing unit 10, and taking FIG. 1 as an example, the light-emitting surface E1 is, for example, flushed with multiple top surfaces of the light-emitting diodes;

LB3 is a horizontal distance from a boundary BL between a light-emitting surface E2 of the second splicing unit 12 and a second reference plane RF2 to the first reference plane RF1, i.e., a distance between the boundary BL and the first reference plane in the horizontal direction DP;

the second reference plane RF2 is perpendicular to the light-emitting surface E2 of the second splicing unit 12 and passes through an upper edge UB2 of the second substrate 120 adjacent to the splicing position X;

the light-emitting surface E2 of the second splicing unit 12 is flushed with the top surfaces of the light-emitting diodes (such as the red light-emitting diode R, the green light-emitting diode G, and the blue light-emitting diode B) in the second splicing unit 12, and taking FIG. 1 as an example, the light-emitting surface E2 is, for example, flushed with the top surfaces of the light-emitting diodes;

an included angle θ between the light-emitting surface E2 of the second splicing unit 12 and the light-emitting surface E1 of the first splicing unit 10 is a splicing angle between the second splicing unit 12 and the first splicing unit 10, in some embodiments, the included angle θ is between 90 degrees and 135 degrees, i.e., 90 degrees≤included angle θ≤135;

LB1x is a horizontal component of a distance LB1 from the boundary BL to a center of the third light-emitting unit 122 (for example, the center C3 of the top of the green light-emitting diode G), i.e., the horizontal component LB1x is an orthogonal projection of the distance LB1 from the boundary BL to the center C3 on the horizontal direction DP;

LA2 is a vertical distance from the light-emitting surface E1 of the first splicing unit 10 to a bottom surface SB1 of the first substrate 100;

LB2 is a vertical distance from the bottom surface SB1 of the first substrate 100 to the boundary BL, i.e., a distance from the bottom surface SB1 to the boundary BL in a vertical direction DV; and LB1y is a vertical component of the distance LB1 from the boundary BL to the center C3 of the third light-emitting unit 122, i.e., the vertical component LB1y is an orthogonal projection of the distance LB1 from the boundary BL to the center C3 on the vertical direction DV.

A following table lists some specific ranges of the above-mentioned parameters, but it should be understood that any parameter ranges that may satisfy the above-mentioned formula are all within a protection scope of the disclosure.

| Example | 1 | 2 | 3 | 4 | 5 |
|---|---|---|---|---|---|
| Pitch P(mm) | 0.20 | 0.40 | 0.60 | 0.80 | 1.27 |
| Included angle θ(degree) | 90~135 | 90~135 | 90~135 | 90~135 | 90~135 |
| Horizontal distance LA1(mm) | 0.03~0.10 | 0.03~0.20 | 0.05~0.30 | 0.07~0.40 | 0.11~0.64 |
| Vertical distance LA2(mm) | 0.3~1.7 | 0.3~1.7 | 0.3~1.7 | 0.3~1.7 | 0.3~1.7 |
| Distance LB1(mm) | 0.03~0.10 | 0.03~0.20 | 0.05~0.30 | 0.07~0.40 | 0.11~0.64 |
| Horizontal component LB1x(mm) | 0~0.07 | 0~0.14 | 0~0.21 | 0~0.28 | 0~0.45 |
| Vertical component LB1y(mm) | 0.01~0.10 | 0.02~0.20 | 0.04~0.30 | 0.05~0.40 | 0.07~0.64 |
| Vertical distance LB2(mm) | −1.7~0.15 | −1.7~0.4 | −1.7~0.48 | −1.7~0.8 | −1.7~1.27 |
| Horizontal distance LB3(mm) | −0.1~0.1 | −0.2~0.2 | −0.3~0.3 | −0.4~0.4 | −0.64~0.64 |

In the above table, except that the horizontal distance LB3 and the vertical distance LB2 have positive and negative values, the other parameters are all positive values. The first reference plane RF1 is taken as a reference line for the positive and negative values of the horizontal distance LB3. When the boundary BL is located on the right side of the first reference plane RF1 (i.e., when viewed from the vertical direction DV, the boundary BL is not overlapped with the first splicing unit 10), the horizontal distance LB3 is a positive value. Conversely, when the boundary BL is located on the left side of the first reference plane RF1 (i.e., when viewed from the vertical direction DV, the boundary BL is overlapped with the first splicing unit 10), the horizontal distance LB3 is a negative value. The bottom surface SB1 of the first substrate 100 is taken as a reference line for the positive and negative values of the vertical distance LB2. When the boundary BL is located below the bottom surface SB1 (i.e., when viewed from the horizontal direction DP, the boundary BL is not overlapped with the first substrate 100), the vertical distance LB2 is a positive value. Conversely, when the boundary BL is located above the bottom surface SB1 (i.e., when viewed from the horizontal direction DP, the boundary BL is overlapped with the first substrate 100), the vertical distance LB2 is a negative value.

It should be noted that the splicing device 1 may further include other elements or film layers according to different requirements. For example, the splicing device 1 may further include a truss, a mechanism support frame, an adhesive layer or other fixing structures for fixing the splicing unit, but the disclosure is not limited thereto. The following embodiments may all be changed in the same way, and details thereof are not repeated.

Although FIG. 1 schematically shows that the splicing angle between the second splicing unit 12 and the first splicing unit 10 (the included angle θ between the light-emitting surface E2 and the light-emitting surface E1) is greater than or equal to 90 degrees, and the second splicing unit 12 is thicker than the first splicing unit 10, it should be understood that various parameters in the splicing device 1 (including the included angle θ, the thickness of the splicing unit, a shape design of the substrate in the splicing unit or a structural design of the light-emitting unit, etc.) may be changed according to actual needs.

Figure 2:
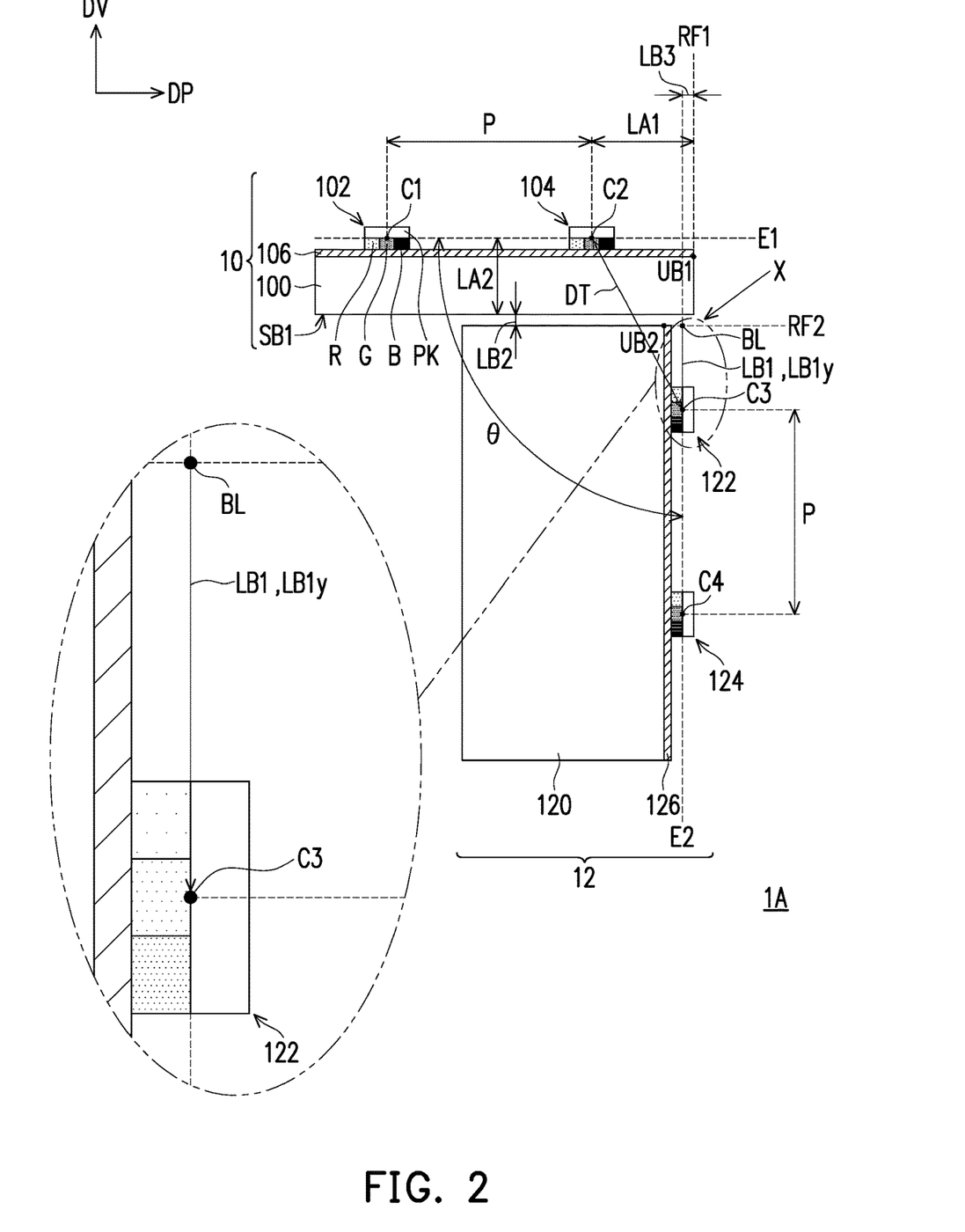

Referring to FIG. 2, main differences between a splicing device 1A and the splicing device 1 of FIG. 1 are described below. In the splicing device 1A, the splicing angle between the second splicing unit 12 and the first splicing unit 10 (the included angle θ between the light-emitting surface E2 and the light-emitting surface E1) is equal to 90 degrees. In addition, the boundary BL is close to the first reference plane RF1 in the horizontal direction DP and is located to the left of the first reference surface RF1, so that the horizontal distance LB3 (referring to FIG. 1) is changed from a positive value to a negative value. Under such design, the distance DT between the second light-emitting unit 104 and the third light-emitting unit 122 may be further reduced, which helps to mitigate the problem of discontinuity of the displayed image.

Although not shown, the second splicing unit 12 in FIG. 2 may be further moved to the left, thereby further reducing the distance DT between the second light-emitting unit 104 and the third light-emitting unit 122.

Figure 3:
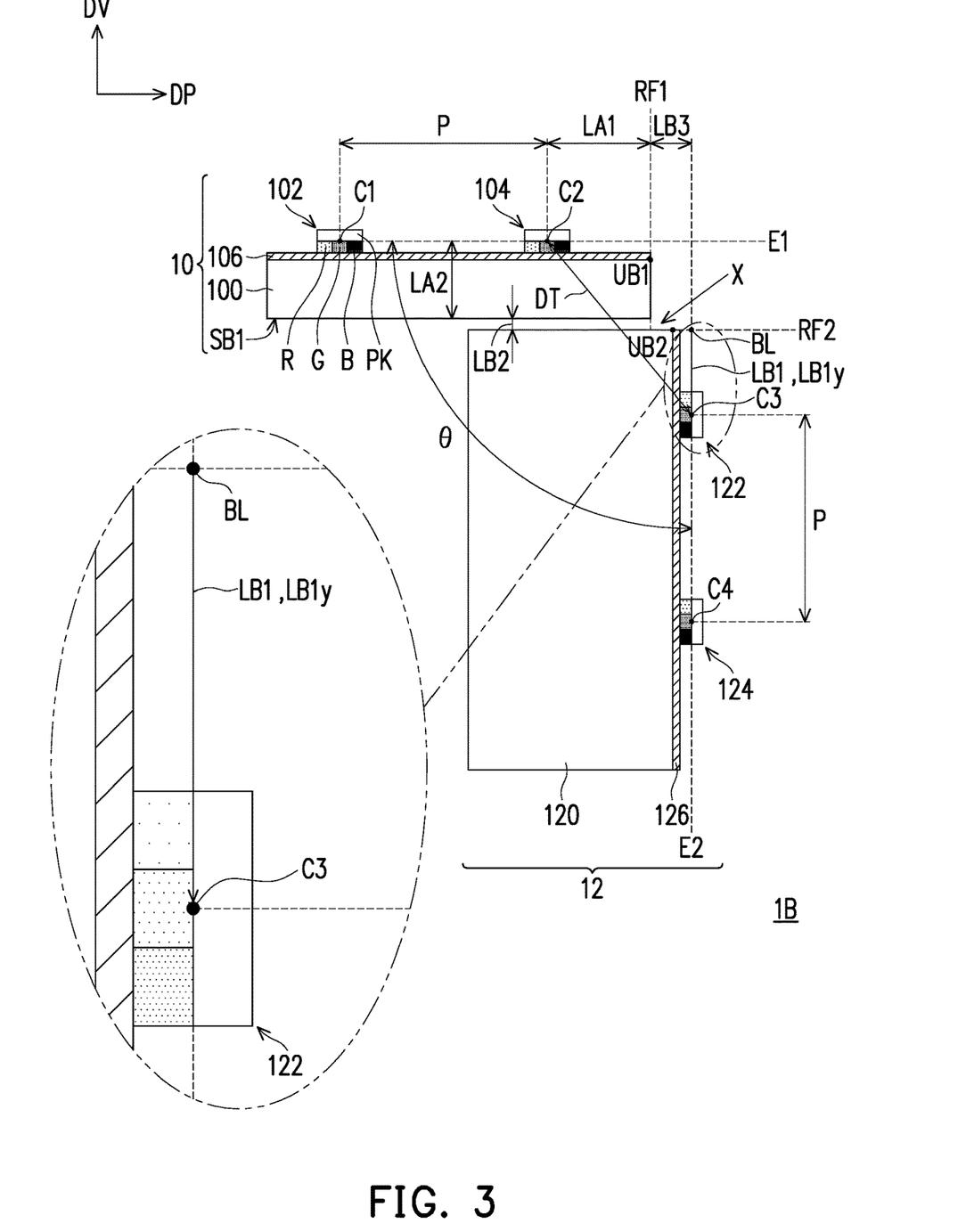

Referring to FIG. 3, a main difference between a splicing device 1B and the splicing device 1 of FIG. 1 is described below. In the splicing device 1B, the splicing angle between the second splicing unit 12 and the first splicing unit 10 (the included angle θ between the light-emitting surface E2 and the light-emitting surface E1) is equal to 90 degrees, and the horizontal component LB1x becomes 0.

Figure 4:
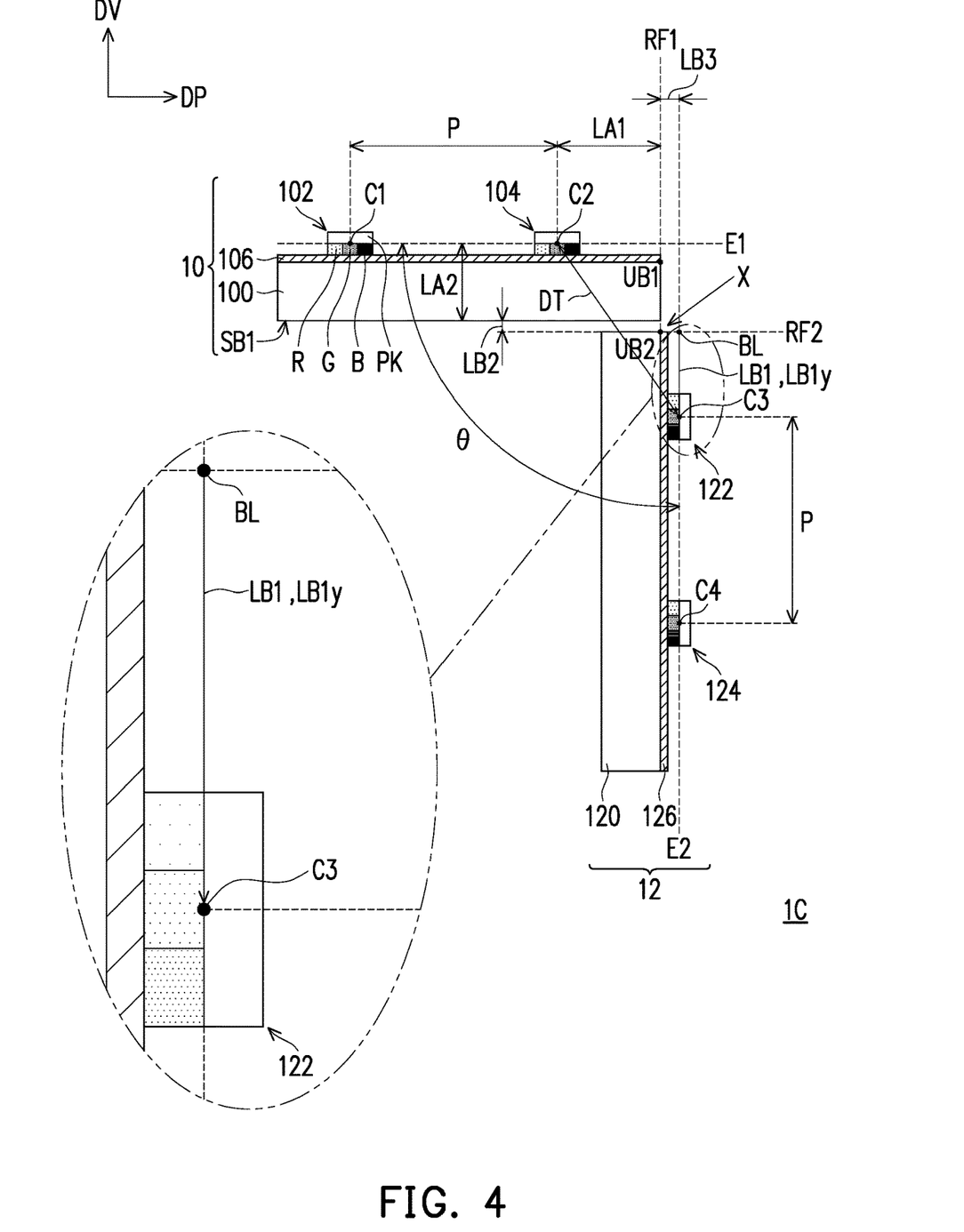

Referring to FIG. 4, main differences between a splicing device 1C and the splicing device 1B of FIG. 3 are described below. In the splicing device 1C, the second splicing unit 12 is moved to the left, so as to reduce the distance DT between the second light-emitting unit 104 and the third light-emitting unit 122 by reducing the horizontal distance LB3. In addition, the second splicing unit 12 and the first splicing unit 10, for example, have the same thickness.

Although not shown, the second splicing unit 12 in FIG. 4 may be further moved to the left or right. In addition, the splicing angle between the second splicing unit 12 and the first splicing unit 10 (the included angle θ between the light-emitting surface E2 and the light-emitting surface E1) may be greater than or equal to 90 degrees and less than or equal to 135 degrees.

Figure 5:
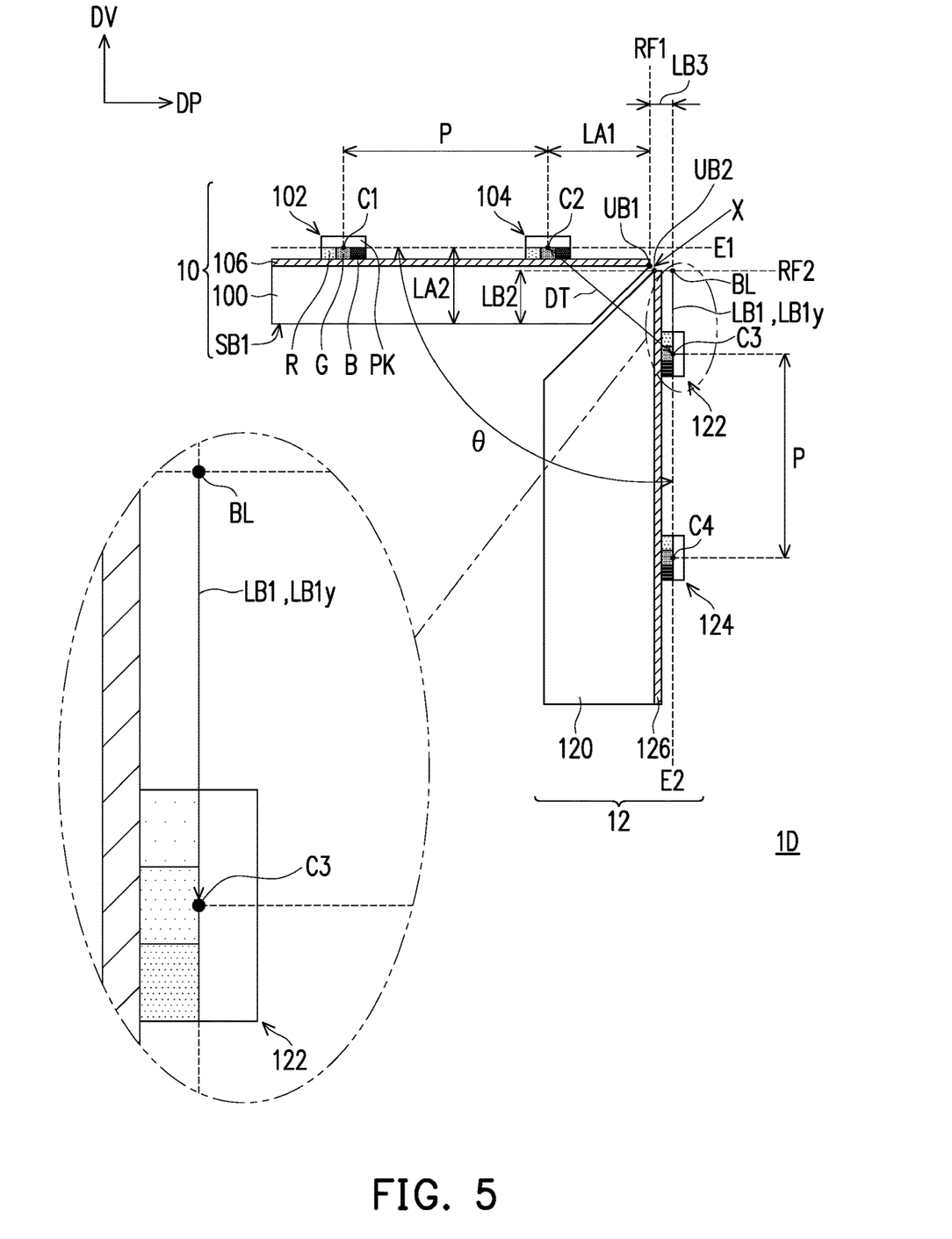

Referring to FIG. 5, main differences between a splicing device 1D and the splicing device 1B of FIG. 3 are described below. In the splicing device 1D, a chamfer design is adopted for the first substrate 100 and the second substrate 120 at a place adjacent to the splicing position X to reduce the vertical distance LB2, for example, the vertical distance LB2 is changed from a positive value to a negative value, thereby further reducing the distance DT between the second light-emitting unit 104 and the third light-emitting unit 122.

Although not shown, the second splicing unit 12 in FIG. 5 may be further moved to the lower left, to the upper right or to the right. In addition, the splicing angle between the second splicing unit 12 and the first splicing unit 10 (the included angle θ between the light-emitting surface E2 and the light-emitting surface E1) may be greater than or equal to 90 degrees and less than or equal to 135 degrees.

Figure 6:
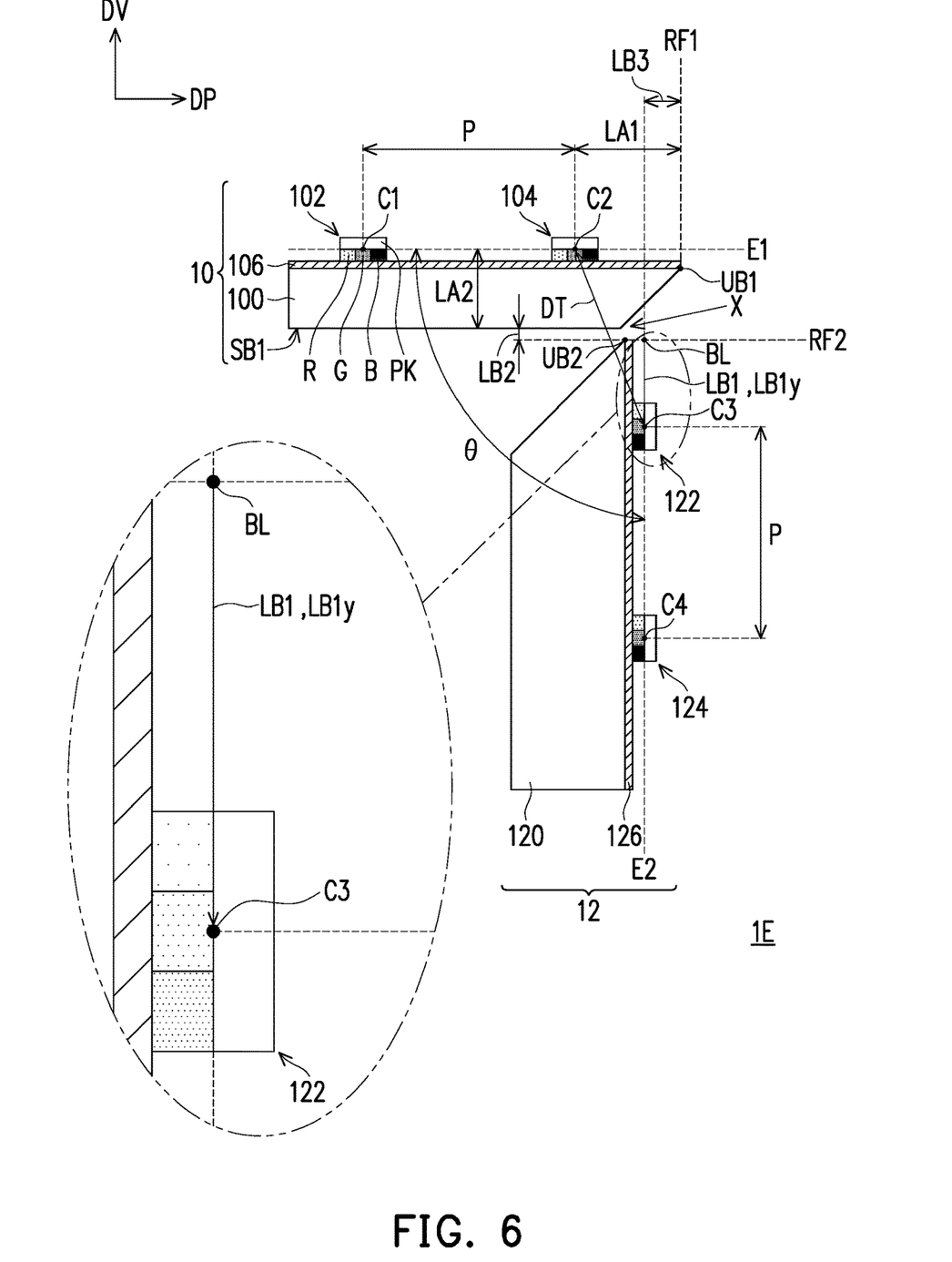

Referring to FIG. 6, main differences between a splicing device 1E and the splicing device 1D of FIG. 5 are described below. In the splicing device 1E, the second splicing unit 12 is further moved to the lower left, so that the horizontal distance LB3 is changed from a positive value to a negative value, and the vertical distance LB2 is changed from a negative value to a positive value.

Although not shown, the second splicing unit 12 in FIG. 6 may be further moved to the lower left or to the upper right. In addition, the splicing angle between the second splicing unit 12 and the first splicing unit 10 (the included angle θ between the light-emitting surface E2 and the light-emitting surface E1) may be greater than or equal to 90 degrees and less than or equal to 135 degrees.

Figure 7:
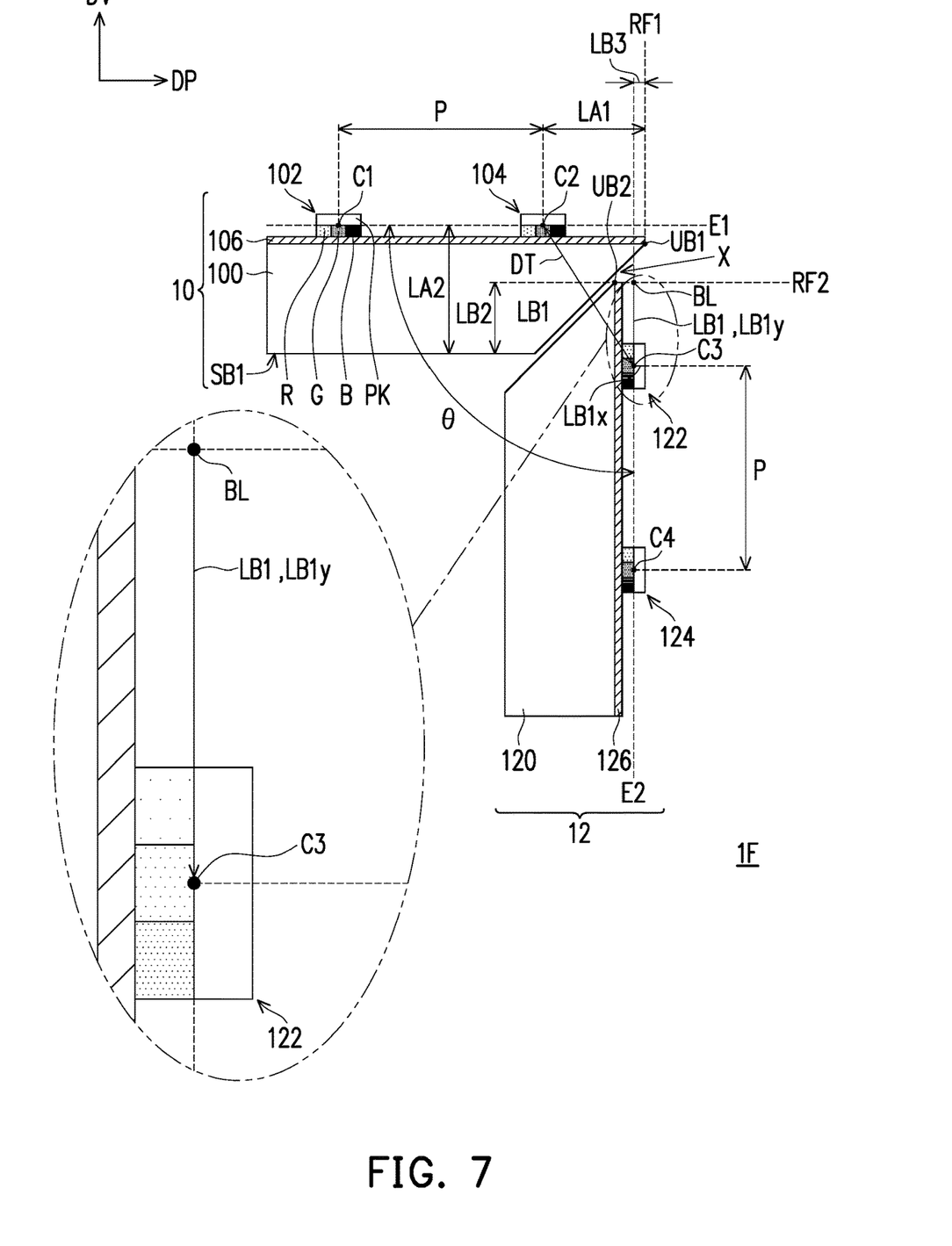

Referring to FIG. 7, main differences between a splicing device 1F and the splicing device 1E of FIG. 6 are described below. In the splicing device 1F, the second splicing unit 12 is further moved to the upper right, so that the horizontal distance LB3 is changed from a negative value to a value approaching 0, and the vertical distance LB2 is changed from a positive value to a negative value. In addition, the second splicing unit 12 and the first splicing unit 10, for example, have the same thickness.

Although not shown, the second splicing unit 12 in FIG. 7 may be further moved to the lower left or to the upper right. In addition, the splicing angle between the second splicing unit 12 and the first splicing unit 10 (the included angle θ between the light-emitting surface E2 and the light-emitting surface E1) may be greater than or equal to 90 degrees and less than or equal to 135 degrees.

Figure 8:
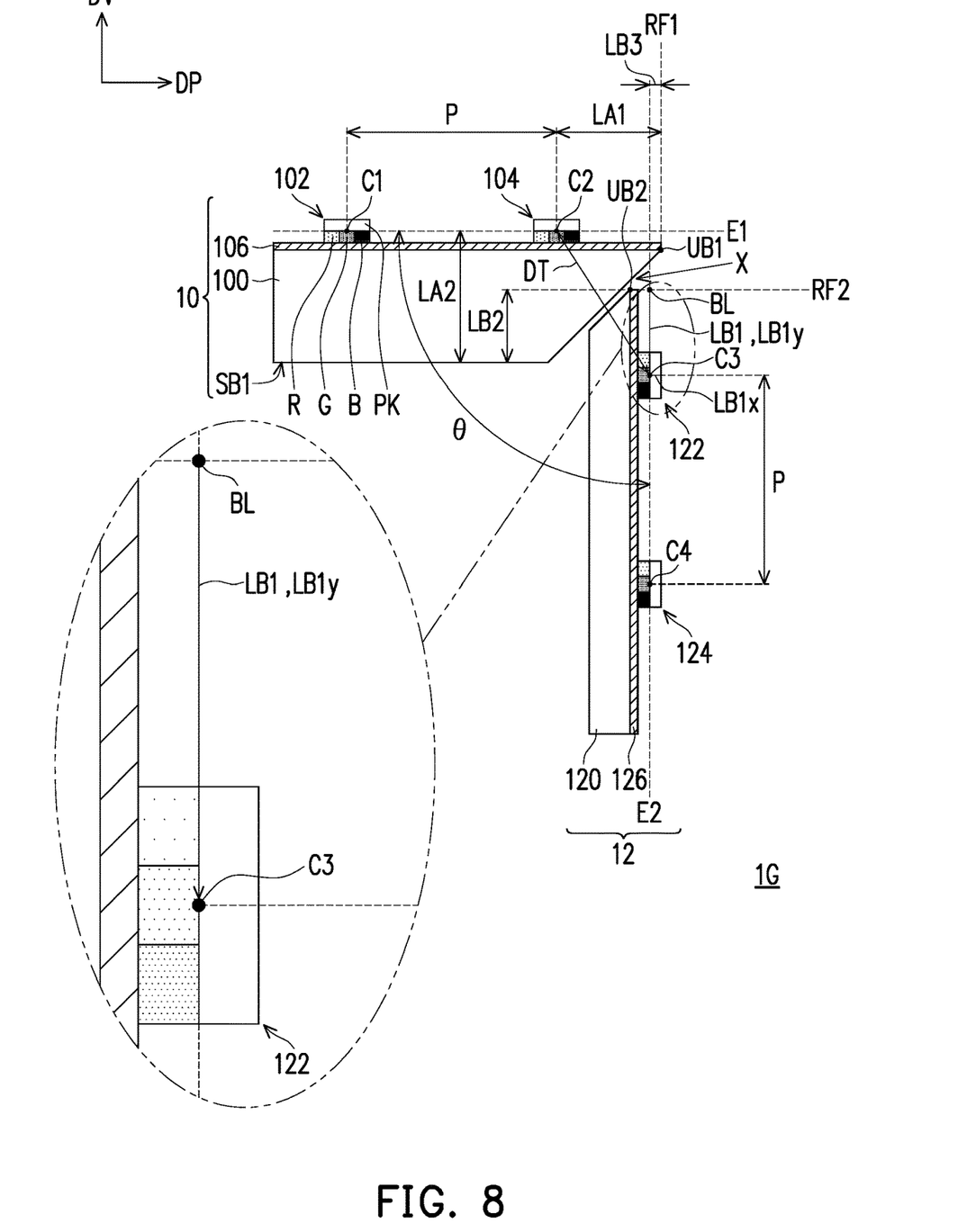

Referring to FIG. 8, main differences between a splicing device 1G and the splicing device 1F of FIG. 7 are described below. In the splicing device 1G, the second splicing unit 12 is thinner than the first splicing unit 10.

Although not shown, the second splicing unit 12 in FIG. 8 may be further moved to the lower left or to the upper right. In addition, the splicing angle between the second splicing unit 12 and the first splicing unit 10 (the included angle θ between the light-emitting surface E2 and the light-emitting surface E1) may be greater than or equal to 90 degrees and less than or equal to 135 degrees.

Figure 9:
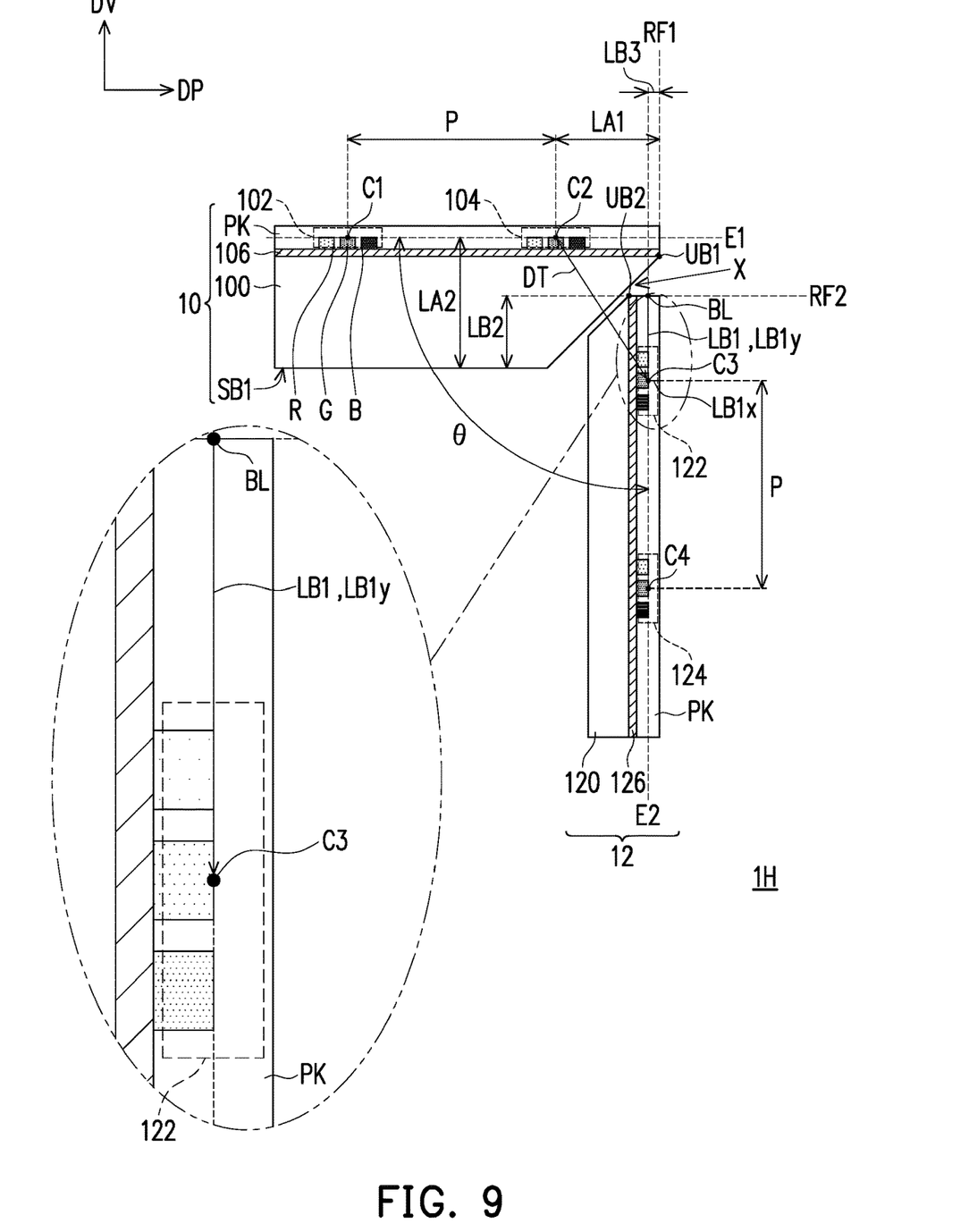

Referring to FIG. 9, main differences between a splicing device 1H and the splicing device 1G of FIG. 8 are described below. In the splicing device 1H, multiple light-emitting units (such as the first light-emitting unit 102 and the second light-emitting unit 104) in the first splicing unit 10 share one package layer PK, and multiple light-emitting units (such as the third light-emitting unit 122 and the fourth light-emitting unit 124) in the second splicing unit 12 share one package layer PK. Although not shown, other embodiments of the disclosure may also adopt the design in which the light-emitting units share one package layer PK, which will not be repeated below.

Figure 10:
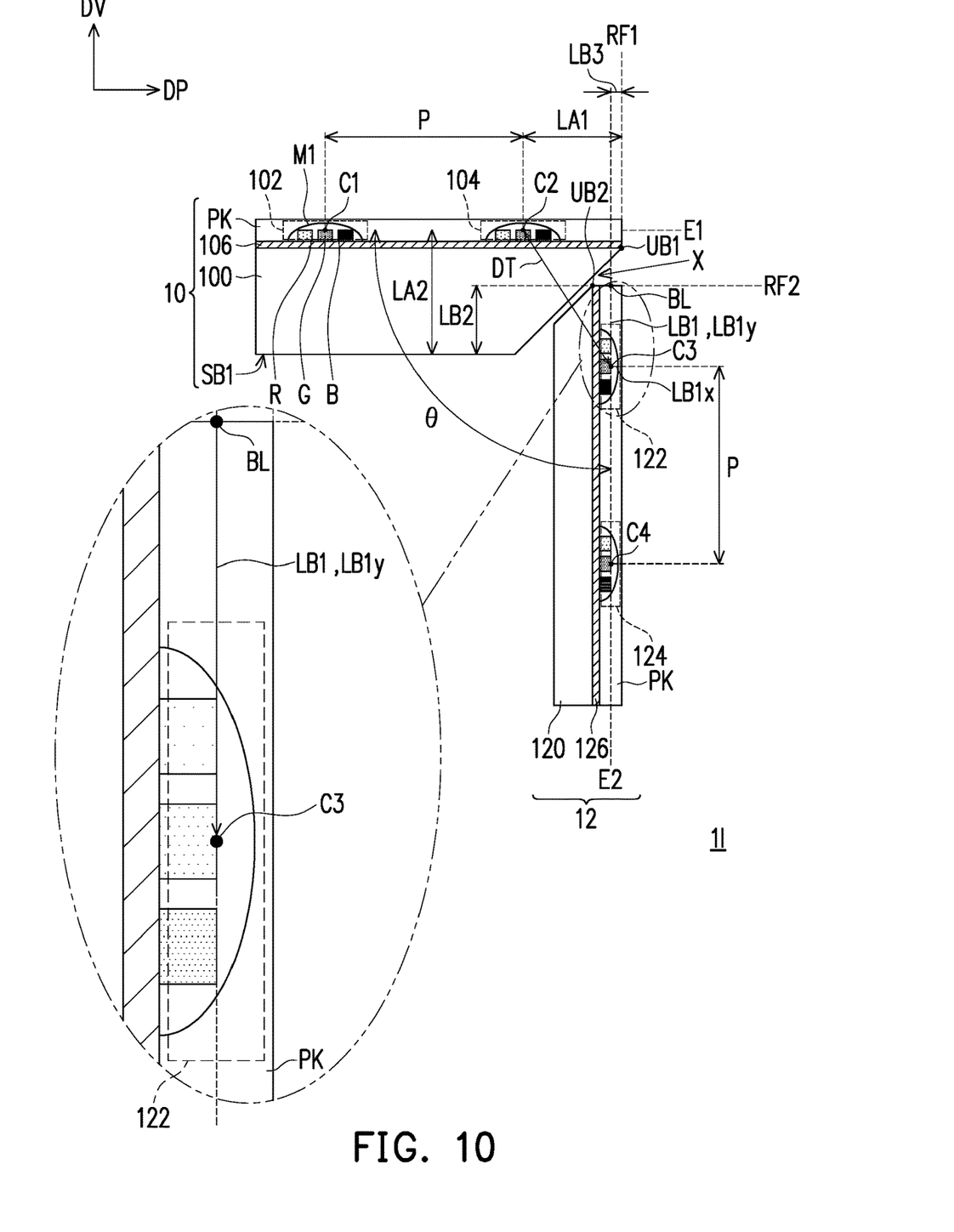

Referring to FIG. 10, main differences between a splicing device 1I and the splicing device 1H of FIG. 9 are described below. In the splicing device 1I, each of the light-emitting units (for example, the first light-emitting unit 102, the second light-emitting unit 104, the third light-emitting unit 122, and the fourth light-emitting unit 124) further includes a microlens ML covering the red light-emitting diode R, the green light-emitting diode G, and the blue light-emitting diode B (FIG. 10 only schematically shows the microlens ML of the first light-emitting unit 102), and the package layer PK in the first splicing unit 10 covers the microlenses ML of the first light-emitting unit 102 and the second light-emitting unit 104, and the package layer PK in the second splicing unit 12 covers the microlenses ML of the third light-emitting unit 122 and the fourth light-emitting unit 124. Although not shown, other embodiments of the disclosure may also adopt the design of the microlens ML, which will not be repeated.

In summary, in the embodiments of the disclosure, through the design of the above formula, visibility of the splicing seam at the corner may be reduced, thereby helping to mitigate the problem of discontinuity of the displayed image.

It will be apparent to those skilled in the art that various modifications and variations can be made to the structure of the invention without departing from the scope or spirit of the invention. In view of the foregoing, it is intended that the invention cover modifications and variations of this invention provided they fall within the scope of the following claims and their equivalents.

Although the embodiments and advantages of the embodiments of the disclosure have been disclosed as above, it should be understood that any person skilled in the art, without departing from the spirit and scope of the disclosure, may make changes, substitutions and modifications, and the features of the embodiments may be arbitrarily mixed and replaced to form other new embodiments. Moreover, a protection scope of the disclosure is not limited to the processes, machines, manufacturing, material composition, devices, methods, and steps of the specific embodiments described in the specification, and any person skilled in the art should understand the processes, machines, manufacturing, material composition, devices, methods, and steps used currently or developed in the future from the content disclosed in the disclosure, as long as the substantially same functions may be implemented or the substantially same results may be obtained in the embodiments described herein. Therefore, the protection scope of the disclosure includes the above processes, machines, manufacturing, material composition, devices, methods, and steps. In addition, each claim constitutes an individual embodiment, and the protection scope of the disclosure also includes a combination of each claim and the embodiment. The protection scope of the disclosure is defined by the appended claims.

What is claimed is:

1. A splicing device, having a splicing position, wherein the splicing device comprises:
   a first splicing unit, comprising:
      a first substrate;
      a first light-emitting unit, disposed on the first substrate; and
      a second light-emitting unit, disposed on the first substrate and located between the first light-emitting unit and the splicing position, wherein a pitch between the first light-emitting unit and the second light-emitting unit is P; and
   a second splicing unit, adjacent to the first splicing unit at the splicing position and comprising:
      a second substrate;
      a third light-emitting unit, disposed on the second substrate; and
      a fourth light-emitting unit, disposed on the second substrate, wherein the third light-emitting unit is located between the splicing position and the fourth light-emitting unit, and a pitch between the third light-emitting unit and the fourth light-emitting unit is also P,
   wherein the splicing device satisfies a following formula:

$$\frac{\sqrt{(LA1 + LB3 + LB1x)^2 + (LA2 + LB2 + LB1y)^2}}{P} \leq 1.5$$

where LA1 is a horizontal distance from a center of the second light-emitting unit to a first reference plane, the first reference plane is perpendicular to a light-emitting surface of the first splicing unit and passes through an upper edge of the first substrate adjacent to the splicing position, LB3 is a horizontal distance from a boundary between a light-emitting surface of the second splicing unit and a second reference plane to the first reference plane, the second reference plane is perpendicular to the light-emitting surface of the second splicing unit and passes through an upper edge of the second substrate adjacent to the splicing position, LB1$x$ is a horizontal component of a distance from the boundary to a center of the third light-emitting unit, LA2 is a vertical distance from the light-emitting surface of the first splicing unit to a bottom surface of the first substrate, LB2 is a vertical distance from the bottom surface of the first substrate to the boundary, and LB1$y$ is a vertical component of the distance from the boundary to the center of the third light-emitting unit.

2. The splicing device according to claim 1, wherein an included angle between the light-emitting surface of the first splicing unit and the light-emitting surface of the second splicing unit is between 90 degrees and 135 degrees.

3. The splicing device according to claim 1, wherein P is between 0.2 mm and 1.27 mm.

4. The splicing device according to claim 1, wherein LA1 is between 0.03 mm and 0.64 mm.

5. The splicing device according to claim 1, wherein LB3 is between −0.64 mm and 0.64 mm.

6. The splicing device according to claim 1, wherein LB1$x$ is between 0 mm and 0.45 mm.

7. The splicing device according to claim 1, wherein LA2 is between 0.3 mm and 1.7 mm.

8. The splicing device according to claim 1, wherein LB2 is between −1.7 mm and 1.27 mm.

9. The splicing device according to claim 1, wherein LB1$y$ is between 0.01 mm and 0.64 mm.

10. The splicing device according to claim 1, wherein a chamfer design is adopted for the first substrate and the second substrate at a place adjacent to the splicing position.

11. The splicing device according to claim 1, wherein the splicing device is a display splicing device.

12. The splicing device according to claim 1, wherein the first splicing unit and the second splicing unit have different thicknesses.

13. The splicing device according to claim 12, wherein the thickness of the second splicing unit is less than the thickness of the first splicing unit.

14. The splicing device according to claim 1, wherein the first splicing unit and the second splicing unit have a same thickness.

15. The splicing device according to claim 1, wherein the boundary is located to a left of the first reference plane.

16. The splicing device according to claim 1, wherein the boundary is located above the bottom surface of the first substrate.

17. The splicing device according to claim 1, wherein each of the first light-emitting unit, the second light-emitting unit, the third light-emitting unit, and the fourth light-emitting unit comprises a plurality of light-emitting diodes, the light-emitting surface of the first splicing unit is flushed with a plurality of top surfaces of the light-emitting diodes of the first light-emitting unit and a plurality of top surfaces of the light-emitting diodes of the second light-emitting unit, the light-emitting surface of the second splicing unit is flushed with a plurality of top surfaces of the light-emitting diodes of the third light-emitting unit and a plurality of top surfaces of the light-emitting diodes of the fourth light-emitting unit.

18. The splicing device according to claim 17, wherein in each of the first light-emitting unit, the second light-emitting unit, the third light-emitting unit, and the fourth light-emitting unit, the light-emitting diodes comprise a red light-emitting diode, a green light-emitting diode, and a blue light-emitting diode.

19. The splicing device according to claim 17, wherein each of the first light-emitting unit, the second light-emitting unit, the third light-emitting unit, and the fourth light-emitting unit further comprises a package layer covering the top surfaces of the light-emitting diodes.

20. The splicing device according to claim 17, wherein each of the first splicing unit and the second splicing unit further comprises a package layer, wherein the package layer of the first splicing unit covers the light-emitting diodes in the first light-emitting unit and the light-emitting diodes in the second light-emitting unit, and the package layer of the second splicing unit covers the light-emitting diodes in the third light-emitting unit and the light-emitting diodes in the fourth light-emitting unit.

* * * * *